(12) United States Patent
Jung

(10) Patent No.: US 7,579,639 B2
(45) Date of Patent: Aug. 25, 2009

(54) CMOS IMAGE SENSOR AND METHOD FOR FABRICATING THE SAME

(75) Inventor: Meng An Jung, Eumseong-gun (KR)

(73) Assignee: Dongbu Electronics Co., Ltd., Seoul (KR)

( * ) Notice: Subject to any disclaimer, the term of this patent is extended or adjusted under 35 U.S.C. 154(b) by 434 days.

(21) Appl. No.: 11/312,352

(22) Filed: Dec. 21, 2005

(65) Prior Publication Data

US 2006/0138485 A1    Jun. 29, 2006

(51) Int. Cl.
  *H01L 31/062*    (2006.01)
(52) U.S. Cl. ............... 257/294; 257/290; 257/292; 257/E31.121; 257/E31.123
(58) Field of Classification Search ........ 257/294, 257/E31.121, E31.123
  See application file for complete search history.

(56) References Cited

U.S. PATENT DOCUMENTS

| 6,362,513 | B2* | 3/2002 | Wester | 257/432 |
| 6,379,992 | B2* | 4/2002 | Jo | 438/70 |
| 7,180,044 | B2* | 2/2007 | Yu | 250/208.1 |
| 7,339,155 | B2* | 3/2008 | Lee | 250/214.1 |
| 2001/0051390 | A1 | 12/2001 | Jo | |
| 2003/0215967 | A1* | 11/2003 | Shizukuishi | 438/22 |
| 2006/0125020 | A1* | 6/2006 | Jung | 257/369 |

FOREIGN PATENT DOCUMENTS

| JP | 07-203317 | 8/1995 |
| JP | 2000-294756 | 10/2000 |

* cited by examiner

*Primary Examiner*—Kenneth A Parker
*Assistant Examiner*—Jose R Diaz
(74) *Attorney, Agent, or Firm*—McKenna Long & Aldridge LLP

(57) ABSTRACT

A CMOS image sensor that includes a semiconductor substrate with a plurality of photodiodes arranged at fixed intervals on the semiconductor substrate. A light-shielding layer partially overlaping the plurality of photodiodes and an insulating interlayer are formed on an entire surface of the semiconductor substrate including the plurality of photodiodes. A color filter layer having a plurality of color filters separated by a predetermined gap is formed on the insulating interlayer and a planarization layer is formed over the entire surface of the semiconductor substrate including the color filter layer. A plurality of microlenses are formed on the planarization layer in correspondence with the color filters of the color filter layer, wherein an additional structural layer, disposed between the color filter layer and the insulating interlayer, is provided to close a predetermined gap between the color filters of the color filter layer.

11 Claims, 3 Drawing Sheets

CMOS IMAGE SENSOR AND METHOD FOR FABRICATING THE SAME

CROSS-REFERENCE TO RELATED APPLICATIONS

This application claims the benefit of Korean Application No. 10-2004-0112056 filed on Dec. 24, 2004, which is hereby incorporated by reference as if fully set forth herein.

BACKGROUND OF THE INVENTION

1. Field of the Invention

The present invention relates to an image sensor, and more particularly, to a CMOS image sensor and a method for fabricating the same, which improves the sensor's image characteristics by employing an additional structural layer for closing a gap between elements of a color filter array.

2. Discussion of the Related Art

Image sensors are semiconductor devices that convert an optical image into an electrical signal and include charge-coupled devices and complementary metal-oxide-semiconductor (CMOS) image sensors. A typical charge-coupled device includes an array of photodiodes converting light signals into electrical signals. This set up, however, has a complicated driving method, high power consumption, and a complicated fabrication process requiring a multi-phased photolithography process. Additionally, in a charge-coupled device, the integration of complementary circuitry such as a control circuit, a signal processor, and an analog-to-digital converter into a single-chip device is difficult, thereby hindering development of compact-sized (thin) products, such as digital still cameras and digital video cameras, that use such image sensors.

CMOS image sensors, on the other hand, adopt CMOS technology that uses a control circuit and a signal processing circuit as a peripheral circuit and adopts switching technology which allows outputs to be sequentially detected using MOS transistors provided in correspondence with the number of arrayed pixels. Additionally, a CMOS image sensor uses CMOS fabrication technology, which is a simple fabrication method with fewer photolithography steps, that enables an advantageous device exhibiting low power consumption.

Typically, in the aforementioned CMOS image sensor, a photodiode is the active device that forms an optical image based on incident light signals by generating electrical signals according to the intensity and wavelength (color) of the incident light. In such a CMOS image sensor, wherein each photodiode senses incident light and a corresponding CMOS logic circuit converts the sensed light into an electrical signal according to the input wavelength, the photodiode's photosensitivity increases as more light is able to reach the photodiode. One way of enhancing a CMOS image sensor's photosensitivity is to improve its "fill factor," i.e., the degree of surface area covered by the photodiodes versus the entire surface area of the image sensor. The fill factor is improved by increasing the area responsive to incident light. The concentration of incident light onto the photodiode is further facilitated when the quantum efficiency at all wavelengths (white light) is "1," which represents a balanced transmission to the photodiodes across the spectrum to include complimentary components of red light, blue light, and green light received by the photodiodes.

To redirect any light that may be incident to the image sensor outside the immediate area of the photodiodes and to concentrate (focus) the incident light on one or more of the photodiodes themselves, a device of a material exhibiting excellent light transmittance, such as a convex microlens having a predetermined curvature for refracting incident light, may be provided. Incident light striking the surface of the convex structure of the microlens while in parallel to the optical axis of the microlens is refracted by the microlens according to the curvature of the convex microlens and is thereby focused at a predetermined point along the optical axis. As FIG. 1 illustrates, a CMOS color image sensor according to the related art may be provided with a microlens layer over a color filter layer including red (R), blue (B), and green (G) filter elements for focusing the light of each color (wavelength).

Referring to FIG. 1, a CMOS image sensor according to the related art includes a semiconductor substrate 100, on which a plurality (array) of photodiodes 110 are arranged at fixed intervals; a light-shielding layer 120 for allowing a light signal reception at each photodiode only by blocking any light arriving between the photodiodes; an insulating interlayer 130 formed over the structure of the light-shielding layer and photodiode array to receive a color filter layer 150 which is patterned into a color filter array including R, G, and B elements corresponding to the photodiode array; and a planarization layer 160 formed over the entire resulting structure to receive a plurality of microlenses 170 corresponding to the color filter array. The individual color filters of the color filter layer 150, which are arranged at fixed intervals, are formed by coating and patterning a corresponding photosensitive material on the insulating interlayer 130. Each coating is patterned by a photolithography step using a separate mask to form a corresponding array of pixels. Each element of the color filter layer 150 is arranged to transmit light of a predetermined wavelength corresponding to the element color.

A predetermined gap inherently occurs along the junctures between adjacently arranged filters that are meant to filter different colors. While the size of this gap is preferably kept to a minimum, its existence is due to the unavoidable error tolerances of the photolithography process used to form the color filter layer during the patterning process of the respective colored resists that make up the color filter layer. The presence of the gap, which is especially problematic at the junction of four adjacently disposed filters arranged as part of the Bayer pattern of a color filter array, precludes optimum photodiode operation because the incident light allowed to pass unfiltered by the color filter layer degrades the image characteristics.

SUMMARY OF THE INVENTION

Accordingly, the present invention is directed to a CMOS image sensor and a method for fabricating the same that substantially obviates one or more problems due to limitations and disadvantages of the related art.

One advantage of the present invention is that it can provide a CMOS image sensor, which improves image characteristics by closing the gap between the elements of a color filter array.

Another advantage of the present invention is that it can provide a CMOS image sensor with improved image characteristics due to the blocking of light incident to a gap existing between the elements of a color filter array.

Another advantage of the present invention is that it can provide a CMOS image sensor having a color filter array with improved image characteristics obtained by including an additional structural layer in conjunction with the color filter layer.

Another advantage of the present invention is that it can provide a CMOS image sensor that prevents degradation of the image-generating characteristics of a photodiode array of the image sensor due to gaps existing between elements of a corresponding color filter array.

Another advantage of the present invention is that it can provide a CMOS image sensor having a color filter array with improved image characteristics by providing greater color separation (delineation) while approximating a color filter array having no gaps between individual color elements.

Another advantage of the present invention is that it can provide a method for fabricating a CMOS image sensor with any of the above mentioned advantages.

Additional examples of advantages and features of the invention will be set forth in part in the description which follows, and in part will become apparent from the description, or by practice of the invention.

To achieve these objects and other advantages in accordance with an embodiment of the present invention, as embodied and broadly described herein, there is provided a CMOS image sensor, comprising a color filter layer having a plurality of color filters separated by a predetermined gap; and an additional structural layer having a pattern for blocking light incident to the color filter layer at the predetermined gap.

In another aspect of the present invention, there is provided a method for fabricating a CMOS image sensor comprising forming, in a semiconductor substrate, a plurality of photodiodes at fixed intervals; forming an insulating interlayer on an entire surface of the semiconductor substrate including the plurality of photodiodes; forming, on the insulating interlayer, a color filter layer having a plurality of color filters separated by a predetermined gap; forming an additional structural layer on the insulating interlayer; forming a planarization layer on the entire surface of the semiconductor substrate including the color filter layer; and forming a plurality of microlenses on the planarization layer in correspondence with the color filters of the color filter layer, wherein the additional structural layer is disposed between the color filter layer and the insulating interlayer and is patterned to close the predetermined gap between the color filters of the color filter layer.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principle of the invention.

In the drawings.

DETAILED DESCRIPTION OF THE INVENTION

Reference will now be made in detail to the embodiments of the present invention, examples of which are illustrated in the accompanying drawings. Wherever possible, like reference designations will be used throughout the drawings to refer to the same or similar parts.

FIGS. 2A-2D illustrate a process for fabricating the CMOS image sensor according to the present invention.

Figure 1:
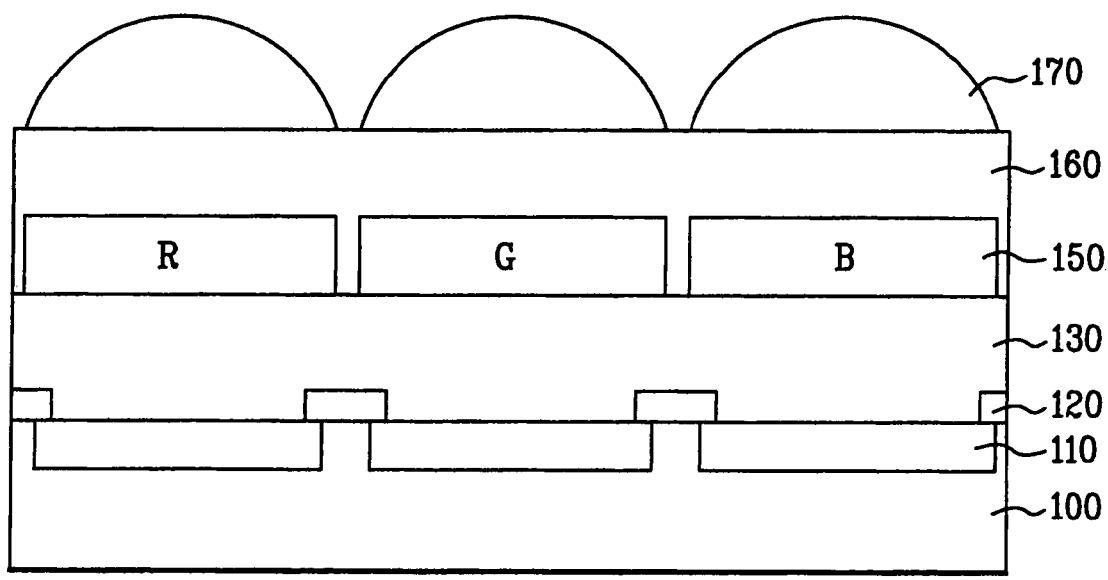
FIG. 1 is a cross-sectional view of a CMOS image sensor according to the related art.
Figure 2A:
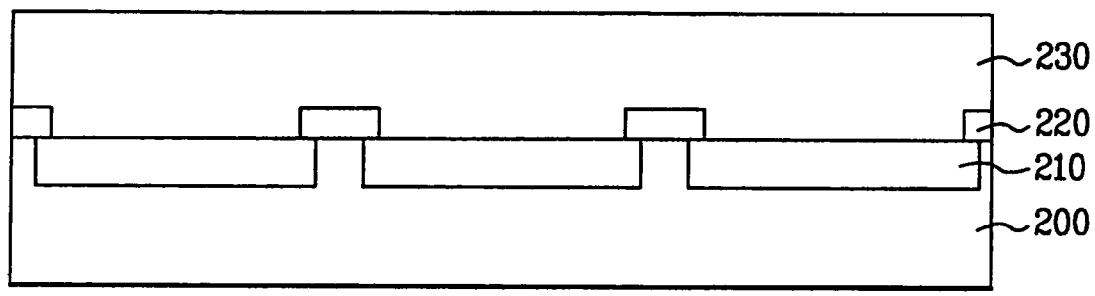
FIGS. 2A-2D are cross-sectional views of the process for fabricating a CMOS image sensor according to the present invention.

As shown in FIG. 2A, a plurality of photodiodes 210 are formed at fixed intervals on the surface of a semiconductor substrate 200. In lieu of photodiodes, photosensitive gates of a transistor (not shown) may serve as the active device for sensing an incident light signal received via a color filter array to generate an image by outputting an electrical signal based on the light signal. A layer of opaque metal, for example chromium, is formed on the entire surface of the semiconductor substrate 200 including the photodiodes 210. The chromium layer is selectively patterned by photolithography leaving the opaque metal on portions of the semiconductor substrate 200 exposed between the photodiodes 210 and covering the exposed portions completely, thereby forming a light-shielding layer 220 for allowing a light signal reception at each photodiode only by blocking any light arriving between the photodiodes. An insulating interlayer 230, which may be formed as a multi-layered structure, is formed on the entire surface of the semiconductor substrate 200 including the light-shielding layer 220.

Figure 2B:
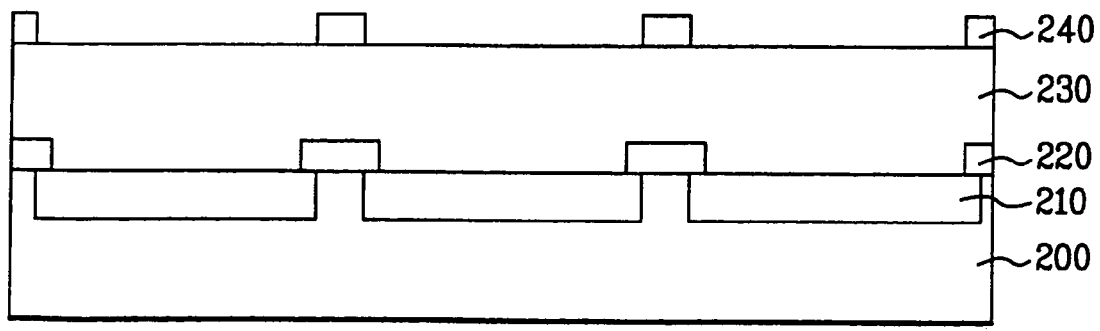

As shown in FIG. 2B, a black photoresist is coated on the insulating interlayer 230 and it is then patterned by an exposure and development process (i.e., photolithography) to form an additional structural layer 240 for blocking any light incident to a predetermined gap that will occur between elements of a color filter array to be formed on the insulating interlayer 230. The additional structural layer 240 may have a pattern analogous to that of the light-shielding layer 220. The respective widths of individual elements of the pattern of the additional structural layer 240 are preferably greater than the corresponding widths of the gaps that inherently occur along the junctures between adjacently arranged filters.

Figure 2C:
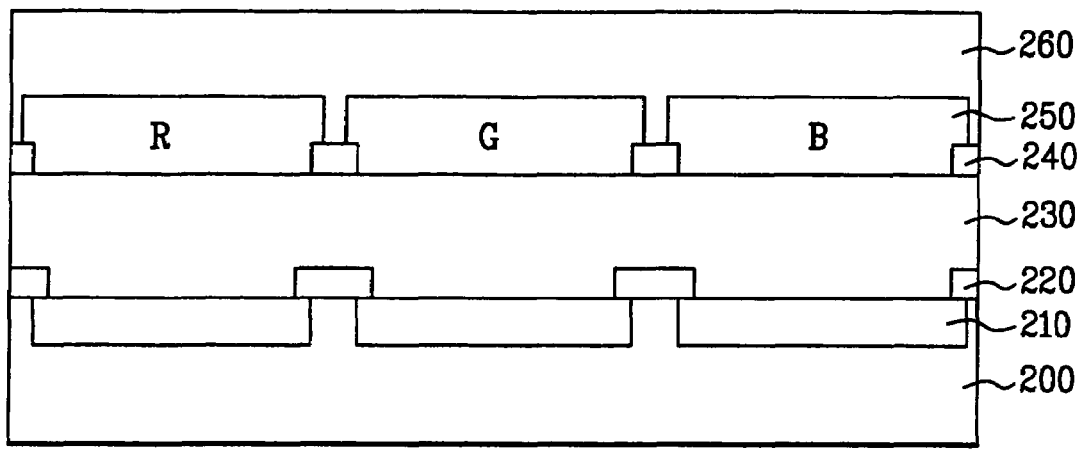

Referring to FIG. 2C, layers of colored resists for filtering light by wavelength are successively coated over the entire surface of the semiconductor substrate 200 including the additional structural layer 240. Each coating is patterned in turn by a photolithography step to give a color filter layer 250 in which the perimeters of the individual elements (i.e., the red, green, and blue filters) of the color filter layer partially overlap adjacent portions of the additional structural layer 240. The additional structural layer 240 is thereby arranged between pattern elements of the color filter layer 250 and is substantially disposed between the color filter layer and the insulating interlayer 230 structurally provided under the color filter layer. The overlap ensures that any light incident to the inter-element gaps is completely blocked and will not enter the insulating interlayer 230 or reach the photodiode array without being filtered. A planarization layer 260 is formed over the entire surface of the semiconductor substrate 200 including the color filter layer 250 to be disposed between the color filters of the color filter layer and atop a portion of the additional structural layer 240 that is left exposed after the photolithography of the respective coatings of the colored resist patterns that make up the color filter layer.

Figure 2D:
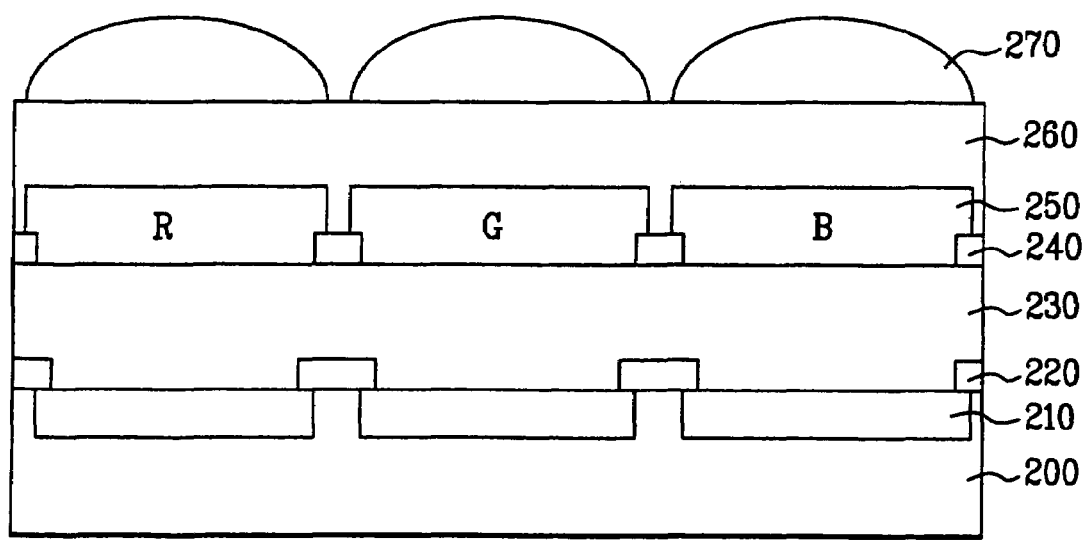

As shown in FIG. 2D, a material layer for microlens formation is coated on the planarization layer 260 and it is then patterned by photolithography to form a microlens pattern (not shown). The microlens material layer may be formed as a resist layer or an oxide layer of, for example, tetra-ethyl-ortho-silicate (TEOS). The microlens pattern is reflowed, using a hot plate or a furnace, to form a plurality of microlenses 270 having a predetermined convex curvature that can be varied according to the heat-shrinking method applied. The microlenses 270 are hardened by irradiation with ultraviolet light to thereby maintain the curvature obtained by the reflowing process. The thus-obtained structure of the microlenses 270, including their curvature and height, determines light-concentration efficiency and the point of focus.

A CMOS image sensor according to the present invention is shown in FIG. 2D. The plurality of photodiodes 210 are arranged at fixed intervals in the semiconductor substrate 200, and the light-shielding layer 220 blocking light arriving between the photodiodes while allowing light signal reception at each photodiode is arranged between the photodiodes and partially overlaps adjacent edges of the photodiodes. The insulating interlayer 230 is formed on an entire surface of the semiconductor substrate 200 including the photodiodes 210. The color filter layer 250, having a plurality of color filters separated by a predetermined gap, is formed on the insulating interlayer 230. The planarization layer 260 is formed over the entire surface of the semiconductor substrate 200 including the color filter layer 250, and the plurality of microlenses 270 is formed on the planarization layer in correspondence with the respective color filters. The additional structural layer 240 is disposed between the color filter layer 250 and the insulating interlayer 230, to have a pattern arrangement corresponding to the junctions of the individual color filters, and is thus provided to close the predetermined gap between the color filters of the color filter layer.

In the CMOS image sensor according to the present invention, it is possible to block light incident to the gap existing between elements of a color filter array by including, in conjunction with the color filter layer, an additional structural layer disposed between the color filter layer and an insulating interlayer provided under the color filter layer. In doing so, the gap is closed and the a degradation in the image-generating characteristics of a photodiode array of the image sensor is prevented. The image characteristics are improved by providing greater color separation (delineation) while approximating a color filter array having no gaps between individual color elements.

It will be apparent to those skilled in the art that various modifications and variations can be made in the present invention without departing from the spirit or scope of the invention. Thus, it is intended that the present invention covers such modifications and variations provided they come within the scope of the appended claims and their equivalents.

What is claimed is:

1. A CMOS image sensor, comprising:
    a plurality of photodiodes formed at fixed intervals on a surface of a semiconductor substrate;
    a light-shielding layer formed on portions of the semiconductor substrate exposed between the photodiodes for allowing a light signal reception at each photodiode only by blocking any light arriving between the photodiodes;
    an insulating interlayer formed on the surface of the semiconductor substrate including the light-shielding layer;
    a color filter layer having a plurality of color filters separated by a predetermined gap formed on the insulating interlayer; and
    an additional structural layer having a pattern for blocking light incident to said color filter layer at the predetermined gap on the insulating interlayer, wherein a pattern of said additional structural layer is partially overlapped by the color filters.

2. The CMOS image sensor of claim 1, wherein said additional structural layer is formed of black photoresist patterned according to the predetermined gap of said color filter layer.

3. The CMOS image sensor of claim 1, wherein said color filter layer is formed by successive applications of a colored resist for filtering light by wavelength, each colored resist being coated on the structure provided under said color filter layer and being separately patterned to overlap adjacent portions of said additional structural layer.

4. The CMOS image sensor of claim 1, wherein the insulating interlayer is formed as a multi-layered structure.

5. The CMOS image sensor of claim 1,
    wherein said light-shielding layer is selectively patterned by photolithography leaving opaque metal on portions of the semiconductor substrate exposed between the photodiodes.

6. The CMOS image sensor of claim 5, wherein said light-shielding layer has a pattern corresponding to an arrangement of the photodiodes.

7. The CMOS image sensor of claim 1, wherein the pattern of said additional structural layer has a width greater than the predetermined gap.

8. The CMOS image sensor of claim 1, wherein said additional structural layer is arranged between the color filters of said color filter layer.

9. The CMOS image sensor of claim 1, further comprising:
    a planarization layer formed on said color filter layer and disposed between the color filters of said color filter layer and atop a portion of said additional structural layer.

10. The CMOS image sensor of claim 1, further comprising:
    a plurality of microlenses respectively disposed above the color filters of said color filter layer.

11. The CMOS image sensor, comprising:
    a semiconductor substrate;
    a plurality of photodiodes arranged at fixed intervals in said semiconductor substrate;
    a light-shielding layer formed on portions of the semiconductor substrate exposed between the photodiodes and partially overlapping said plurality of photodiodes;
    an insulating interlayer formed on an entire surface of said semiconductor substrate including said plurality of photodiodes;
    a color filter layer, formed on said insulating interlayer, having a plurality of color filters separated by a predetermined gap;
    a planarization layer formed on the entire surface of said semiconductor substrate including said color filter layer;
    a plurality of microlenses formed on said planarization layer in correspondence with the color filters of said color filter layer; and
    an additional structural layer disposed between said color filter layer and said insulating interlayer, wherein the additional structural layer is provided to close the predetermined gap between the color filters of said color filter layer and partially overlapped by the color filters.

* * * * *